United States Patent [19]
Matsuda et al.

[11] Patent Number: 5,095,200
[45] Date of Patent: Mar. 10, 1992

[54] OPTOELECTRONIC MEMORY, LOGIC, AND INTERCONNECTION DEVICE INCLUDING AN OPTICAL BISTABLE CIRCUIT

[75] Inventors: Kenichi Matsuda, Moriguchi; Jun Shibata, Kawachingano, both of Japan

[73] Assignee: Matsushita Electric Industrial Co., Ltd., Kadona, Japan

[21] Appl. No.: 640,278

[22] Filed: Jan. 11, 1991

[30] Foreign Application Priority Data

Jan. 19, 1990 [JP] Japan .................................. 2-11312
Jun. 6, 1990 [JP] Japan .................................. 2-147807

[51] Int. Cl.⁵ .............................................. H01J 31/50
[52] U.S. Cl. ................................. 250/213 A; 377/102
[58] Field of Search .................. 250/213 A; 365/106, 365/107, 108, 109, 110, 111, 112; 377/102

[56] References Cited

U.S. PATENT DOCUMENTS

| | | | |
|---|---|---|---|
| 4,546,244 | 10/1985 | Miller | 377/102 |
| 4,588,896 | 5/1986 | Abbas | 250/213 A |
| 4,689,793 | 12/1987 | Liu et al. | 250/213 A |
| 4,782,223 | 11/1988 | Suzuki | 250/213 A |
| 4,914,286 | 4/1990 | Chirovsky et al. | 250/213 A |

FOREIGN PATENT DOCUMENTS 2210334 8/1990 Japan .

*Primary Examiner*—David C. Nelms
*Assistant Examiner*—John R. Lee
*Attorney, Agent, or Firm*—Ratner & Prestia

[57] ABSTRACT

An optoelectronic memory, logic, and interconnection device having an optical bistable circuit as an essential element. The optical bistable circuit includes an optical bistable switch which is a light emitting device and a first phototransistor detecting the light emitted from the light emitting device, connected in series, a second phototransistor connected in parallel to the optical bistable switch which does not detect the light emitted from the light emitting device, and a load resistor connected in series to the optical bistable switch. The optoelectronic memory, logic, and interconnection device operates as an optoelectronic memory device turned on and off with the same light source, as an optoelectronic logic device executing exclusive OR operation, or as a light source for reconfigurable optical interconnection.

10 Claims, 9 Drawing Sheets

F I G. 8
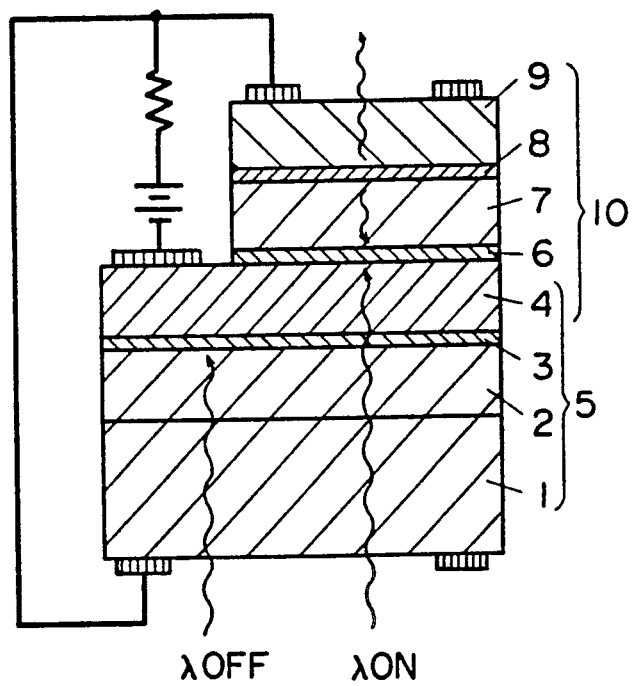
λOFF   λON

OPTOELECTRONIC MEMORY, LOGIC, AND INTERCONNECTION DEVICE INCLUDING AN OPTICAL BISTABLE CIRCUIT

BACKGROUND OF THE INVENTION

This invention relates to an optoelectronic memory, logic, and interconnection device with functions of memory, logic operation, and optical interconnection, which is based on an optical bistable circuit turned on and off with optical signals.

An example of optoelectronic memory devices operating with optical input and output is an image memory device described in the Japanese Patent Application No. 60-184047. This device is a two dimensional array of optical bistable switches, each of which is a series connection of a light emitting device and a phototransistor detecting the light emitted from the light emitting device. It functions as an image memory device which memorizes a two-dimensional pattern input with optical signals. It also outputs optical signals. This function is based on the characteristics of the optical bistable switch which emits light by itself when it is turned on with an optical input, and continues to maintain the on-state and emit output light after the input light is stopped. To reset the memorized contents, a power supply voltage is once set to zero. In case other optical signals are input without reset, the OR operation of two-dimensional patterns can be executed since the OR pattern of the first optical signals and the second optical signals are output.

Since the image memory device mentioned above is reset by setting the power supply voltage to zero, it is impossible to turn off the individual switches selectively. To improve this defect and make it possible to turn off the switch with an optical signal, an optical memory device was invented as described in Japanese Patent Application No. 60-151578. In this device, the second phototransistor is connected in parallel to the optical bistable switch and the optical bistable switch can be turned off by inputting light into the second phototransistor. The concrete structure of this device is shown in FIG. 8. A second phototransistor 5 is constructed with a first collector layer 2, a first base layer 3, an emitter layer 4 on a semiconductor substrate 1, and an optical bistable switch 10 is constructed of the emitter layer 4, a second base layer 6, a second collector layer 7, and active layer 8, and a cladding layer 9.

The input lights which turn on and off the optical bistable switch are incident through the semiconductor substrate 1. The energy bandgap of the first base layer is wider than that of the second base layer. The input light with a wavelength of $\lambda_{on}$ satisfying $\lambda_1 < \lambda_{ON} \leq \lambda_2$, where $\lambda_1$ and $\lambda_2$ are the wavelengths corresponding to the bandgap of the first and the second base layer, respectively, is transmitted through the first base layer and absorbed in the second base layer. Therefore, the optical bistable switch can be turned on with the input light having a wavelength of $\lambda_{ON}$. On the other hand, the input light with a wavelength of $\lambda_{OFF}$ satisfying $\lambda_{OFF} \leq \lambda_1$ is absorbed in the first base layer and can turn off the optical bistable switch.

In the optical memory device mentioned above, two input light sources are necessary to turn on and off the optical bistable switch since the wavelengths of the input light to turn on the switch and the input light to turn off the switch are different. Considering the case that the input lights for the first phototransistor and for the second phototransistor are distinguished not by wavelength but by spatial location, two light sources are still necessary.

Next, the background in relation to an optoelectronic interconnection device used for data transmission with optical signals is described. An example of such optoelectronic interconnection devices in shown in FIG. 9 which is demonstrated by S. Kawai et al. in the Conference Record of 1990 International Topical Meeting on Optical Computing, paper 10E7. In this construction, crossbar switching is attained by using an optical bistable switch array 12 in which optical bistable switches 11 with a function of light emission are arranged in a two-dimensional array, and a photodetector array 14 in which photodetectors 13 are arranged in a one-dimensional array.

The operation of the optical bistable switch is first described. The optical bistable switch has characteristics shown in FIG. 10 in relation to applied voltage and optical output power. When the applied voltage is below the holding voltage $V_H$, it is always in the off-state and does not emit output light. On the other hand, it is always in the on-state and emits output light when the applied voltage is larger than the transition voltage $V_T$. Considering the case that the applied voltage is between $V_H$ and $V_T$, it is either in the "on" or "off" state. The output power in the on-state can be modulated with the applied voltage. Furthermore, the optical bistable switches 11 in the optical bistable switch array 12 can be addressed electrically since the anodes of these switches are wired along the column direction, while the cathodes are wired along the row direction. The bias voltage $V_A$ between $V_H$ and $V_T$ is usually applied between anode lines 17 and cathode lines 18. By increasing the potential of the selected anode line in $(V_T-V_A)/2$ and decreasing the potential of the selected cathode line in $(V_T-V_A)/2$, the optical bistable switch on the intersection of the selected anode and cathode lines is turned on selectively.

The operation principle of this device is described below. To perform data transmission using this device, the potential of the cathode lines are fixed and that of the anode lines are modulated between $V_A$ and $V_B$ ($V_A < V_B < V_T$). Corresponding to this, modulated optical signals are emitted from the optical bistable switches in the on-state. These modulated optical signals are detected by the photodetectors 13 in the photodetector array 14. The optical signals from the optical bistable switches 11 along the same row are incident upon the same photodetector and converted to electrical signals. Therefore, the crossbar switching can be achieved because the electrical signals put into the anode lines along the column direction are converted to optical signals, which are again converted to electrical signals with the long photodetectors along the row direction, where the connection points between the column and row are determined by the position of the optical bistable switch in the on-state.

In practical operation, it is necessary to turn on the optical bistable switches on the connection points before starting the data transmission. To execute this, the potential of all the anode lines is first decreased in $V_A-V_H$ to turn off all of the optical bistable switches. Then the potential of the cathode lines is decreased in $(V_T-V_A)/2$ one by one, when the potential of the selected anode line is increased in $(V_T-V_A)/2$. As a result, the optical bistable switches on the connection point are turned on selectively. After the selection of connection points with the reset signal and the address signal as mentioned above, the data transmission is started.

In the optoelectronic interconnection device mentioned above, the data transmission is interrupted to input the reset signal and the address signal always when the connection points are changed. The length of address signal and the period of interruption becomes longer as the number of switched lines becomes larger. Furthermore, in this device the data transmission with optical signals is only utilized for a very short distance between the optical bistable switches and the photodetectors, and all the inputs and outputs are electrical signals. In other words, this device minimally utilizes the merit of optical signal transmission, that is, free-space parallel transmission.

SUMMARY OF THE INVENTION

In the optical memory device mentioned above, two input light sources are necessary to turn on and off the optical bistable switch. The first object of this invention is to offer an optoelectronic memory device which is turned on and off with a single input light.

In the image memory device mentioned above, the OR operation of two-dimensional patterns can be achieved. However, exclusive OR operation should be executed in application to pattern matching. The second object of this invention is to offer an optoelectronic logic device which performs the exclusive OR operation.

The third object of this invention is to offer an optoelectronic interconnection device where the interconnection points can be changed without interruption of data transmission, and an optoelectronic interconnection device utilizing the merit of optical signal transmission.

In a first embodiment, an optoelectronic memory device is constructed with an optical bistable circuit, a power supply, and a light source. The optical bistable circuit includes an optical bistable switch which is a series connection of a light emitting device and a first phototransistor detecting the light emitted from the light emitting device, a second phototransistor connected in parallel to the optical bistable switch which does not detect the light emitted from the light emitting device, and a load resistor connected in series to the optical bistable switch. The power supply is for applying variable voltage to the optical bistable circuit. The light source is for putting an input light into the first and the second phototransistors simultaneously.

The optical bistable circuit, in which the optical bistable switch consisting of a light emitting device and a first phototransistor is connected in parallel to a second phototransistor and in series to a load resistor, is the same as the optical memory device described in Japanese Patent Application No. 60-151578. The advantage of the present invention is that the same input light is incident upon both the first and the second phototransistors. There are two cases that the optical bistable switch is turned on and off when the input lights are incident upon the first and the second phototransistors simultaneously. Whether the optical bistable switch is turned on or off depends on the equivalent gain of the first and the second phototransistors, the value of the load resistance, and the bias voltage applied to the whole circuit. If the equivalent gain of the phototransistors and the value of the load resistance are set properly, the on or off state of the optical bistable switch can be controlled with the bias voltage. Therefore, the switch can be turned on and off with the same input light by varying the bias voltage.

In a second embodiment, an optoelectronic logic device comprises a first and a second optical bistable circuit and a first and a second light source. The first optical bistable circuit includes a first optical bistable switch which is a series connection of a first light emitting device and a first phototransistor detecting the light emitted from the first light emitting device, a second phototransistor connected in parallel to the first optical bistable switch which does not detect the light emitted from the first light emitting device and a first load resistor connected in series to the first optical bistable switch. The second optical bistable circuit includes a second optical bistable switch which is a series connection of a second light emitting device and a third phototransistor detecting the light emitted from the second light emitting device, a fourth phototransistor connected in parallel to the second optical bistable switch which does not detect the light emitted from the second light emitting device, and a second load resistor connected in series to the second optical bistable switch. The first light source is for inputting a first input light into the first and the fourth phototransistors, and the second light source is for putting a second input light into the second and the third phototransistors.

In this optoelectronic logic device, the first and the second optical bistable circuits are arranged side by side so that the first input light can be incident upon the first and the fourth phototransistors simultaneously and that the second input light can be incident upon the second and the third phototransistors simultaneously. Here, the first and the second optical bistable circuits are designed to be turned off when the input lights are incident upon both phototransistors in each optical bistable circuit. Under these conditions, the first optical bistable circuit is turned on only when the first input light is "on" and the second input light is "off". The second optical bistable circuit is turned on only when the first input light is "off" and the second input light is "on". Therefore, both of the optical bistable circuits are in the off state and do not emit output light when the on or off states coincide for both input lights, and one of the optical bistable circuits is in the on state and emits output light when the states are different for both input lights. This function is just the exclusive OR operation.

In a third embodiment, an optoelectronic interconnection device comprises an optical bistable circuit array in which optical bistable circuits turned on and off with optical signals are arranged in a two-dimensional array, and a light emitting device array in which controlling light emitting devices are arranged in a two-dimensional array. The optical bistable circuit has a function of light emission. The controlling light emitting device is for emitting an optical signal to control the on or off state of the optical bistable circuit in the optical bistable circuit array. The light emitting device array has conductive lines for addressing selectively the controlling light emitting devices.

In this optoelectronic interconnection device, optical bistable switches in the optical bistable circuits are modulated on the same principle as the conventional optoelectronic interconnection device described in the background of the invention. However, the on or off states of the optical bistable switches are controlled with selective light emission from the controlling light emitting device in the light emitting device array. Therefore, the address signal is put into the controlling light emitting device and only the data signal is put into the optical bistable switch. Since the optical bistable switches are not only turned on but also turned off selectively with light emission from the controlling light emitting devices, the change of connection points does not interrupt the data signal transmission through the unchanged connection points. In other words, the change of connection points and the data transmission through the unchanged connection points are executed at the same time.

In a fourth and a fifth embodiment, the optoelectronic interconnection device includes a light beam deflector for varying the output direction of light beam emitted from the optical bistable circuit in relation to the position of the optical bistable circuit in the optical bistable circuit array. In these embodiments, the lights emitted from the optical bistable switches are not detected with a neighboring photodetector array but by photodetectors located spatially far from the optical bistable circuit array. The output direction of the light beam is varied by deciding the position of the optical bistable switch in the on-state, and only a specific photodetector among the photodetectors located separately detects the optical signal on the light beam. In the case where this device is applied to interconnections between processor units of a parallel processing computer, reconfigurable interconnection can be achieved by installing the optoelectronic interconnection device and the photodetector in each processor unit.

BRIEF DESCRIPTION OF DRAWINGS

FIG. 8 is a sectional view of a conventional optoelectronic memory device;

DETAILED DESCRIPTION OF THE INVENTION

Figure 1:
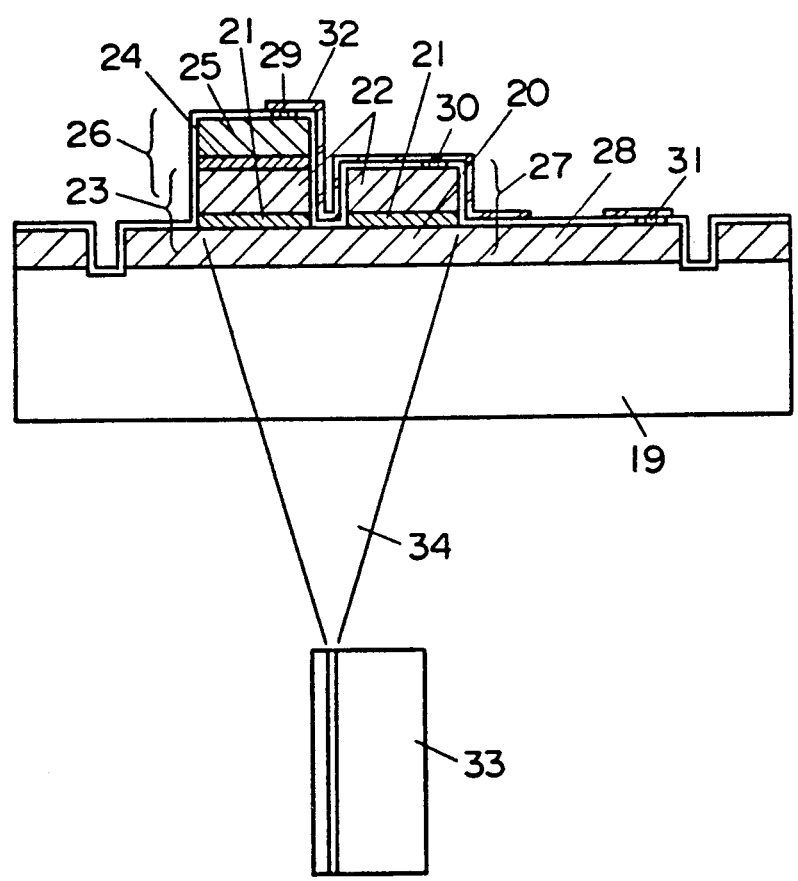
FIG. 1 is a sectional view of an optoelectronic memory, logic, and interconnection device according to one embodiment of the present invention.

A sectional view of an optoelectronic memory, logic, and interconnection device according to one embodiment of the present invention is shown in FIG. 1. An n-InP emitter layer 20 is laid on a semi-insulating InP substrate 19. On a partial region of the emitter layer 20, a p-InGaAsP (bandgap wavelength $\lambda g = 1.3$ $\mu$m) base layer 21 and an n-InP collector 22 are overlaid to form a first phototransistor 23, on which an InGaAsP ($\lambda g = 1.3$ $\mu$m) active layer 24 and a p-InP cladding layer 25 are overlaid to form a light emitting device 26. On another partial region of the emitter layer 20, only the base layer 21 and the collector layer 22 are overlaid to form a second phototransistor 27. A partial region of the residual emitter layer 20 is used as a load resistor 28. A first contact 29, a second contact 30, and a third contact 31 are formed on the cladding layer 25 of the light emitting device 26, the collector layer 22 of the second phototransistor 19, and the load resistor 28, respectively. The first contact 29 and a second contact 30 are connected with an interconnection metal 32, and variable bias voltage is applied between the interconnection metal 32 and the third contact 31. A light source 33 With a wavelength of 1.3 $\mu$m is set outside of the semiconductor substrate 33, and an input light 34 emitted from it is incident upon the first and the second phototransistors.

Figure 2:
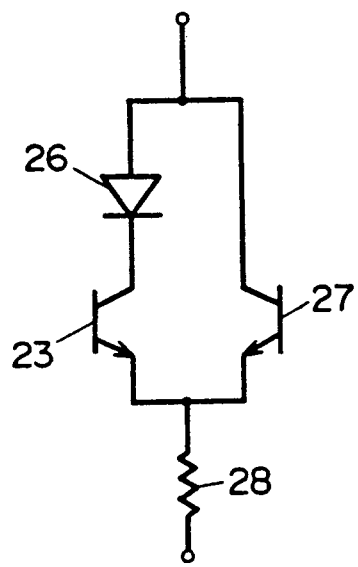
FIG. 2 is a equivalent circuit diagram of an optoelectronic memory, logic, and interconnection device according to the same embodiment.
Figure 3:
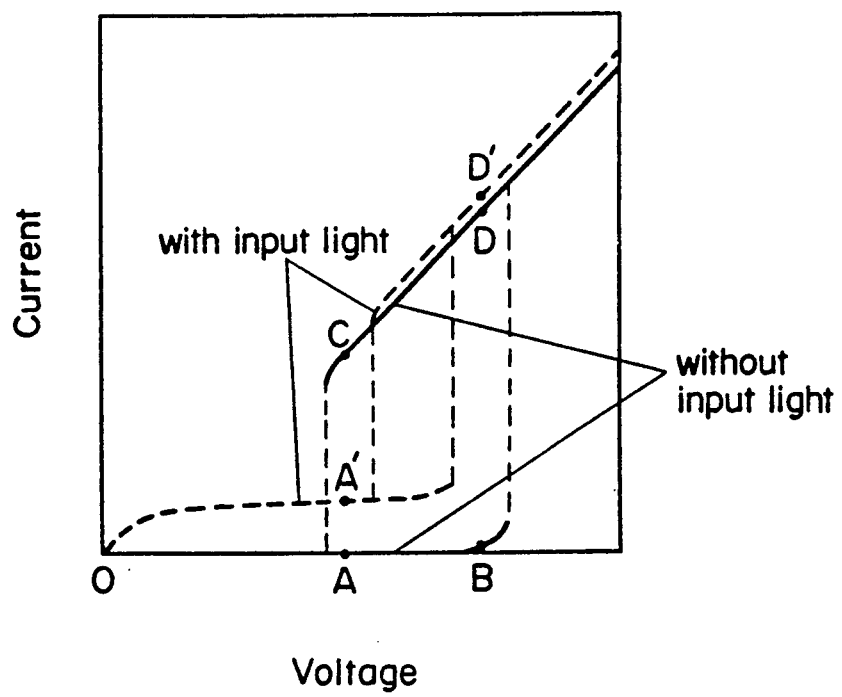
FIG. 3 is a diagram showing the voltage-current characteristics of an optoelectronic memory, logic, and interconnection device according to the same embodiment.

The equivalent circuit of this embodiment is shown in FIG. 2. The light emitting device 26 and the first phototransistor 23 are connected in series to form the optical bistable switch. The second phototransistor 37 is connected in parallel to the optical bistable switch and the load resistor 28 is in series to it. The voltage-current characteristics of this circuit are shown in FIG. 3. The solid line in the figure shows the characteristics when the input light 34 is not incident, and the dashed line when the input light 34 is incident. The points A, A', B, C, D, and D' in the figure are operation points of the circuit. The points A, A' and B correspond to the off state of the optical bistable switch, while the points C, D, D' correspond to the on state. The case where in the input light 34 is not incident is considered first. Since all the points A, B, C, and D are operation points, the state of the optical bistable switch is not changed while the bias voltage is varied between A and B (C and D). Then the case where the input light is incident is considered.

If the bias voltage is set to B (D) and the operation point before illumination is B, it moves to D' after illumination since the point B is no longer the operation point. The point D' moves to D after the input light is stopped. As a result, the optical bistable switch is turned on by inputting the input light. On the other hand, if the bias voltage is set to A (C) and the operation point is C, it moves to A' with illumination. It moves to A after the input light is stopped. As a result, the optical bistable switch is turned on with the input light. Therefore, in this circuit the optical bistable switch can be turned on and off with the same input light because whether it is turned on or off is controlled by varying the bias voltage when the input light is incident.

Figure 4:
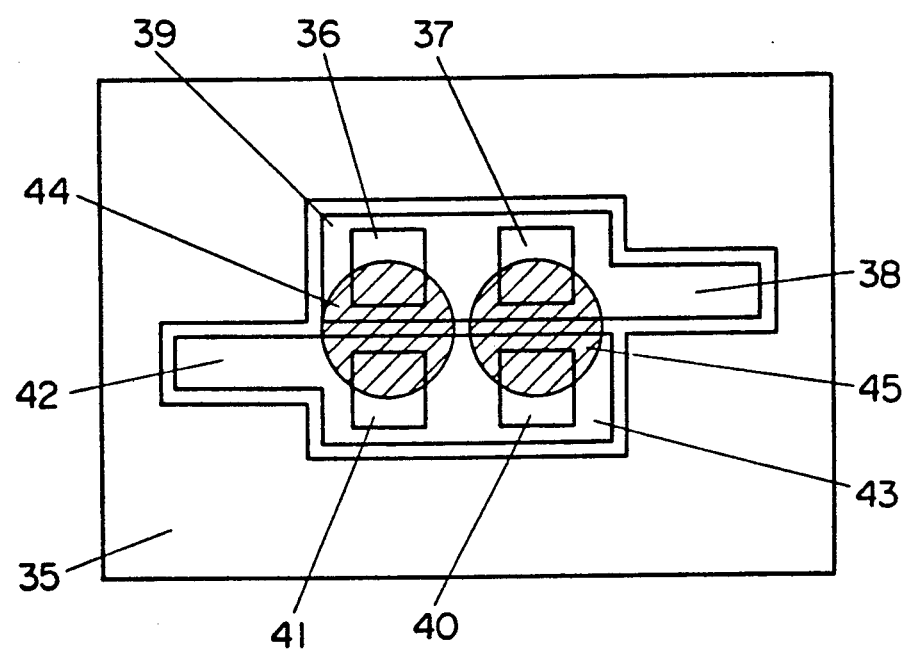
FIG. 4 is a plane view of an optoelectronic memory, logic, and interconnection device according to a second embodiment of the present invention.

A plane drawing of an optoelectronic memory, logic, and interconnection device according to a second embodiment of the present invention is shown in FIG. 4. A first optical bistable switch 36 which is a series connection of a first light emitting device and a first phototransistor, a second phototransistor 37, and a first load resistor 38 are arranged on a semiconductor substrate 35 to form a first optical bistable circuit 39. A second optical bistable switch 40 which is a series connection of a second light emitting device and a third phototransistor, a fourth phototransistor 37, and a second load resistor 38 are arranged to form a second optical bistable circuit 39. Each of the first and the second optical bistable circuits has the same sectional view as the structure on the semiconductor substrate 19 shown in FIG. 1, and has the same equivalent circuit as shown in FIG. 2. The difference between this embodiment and the first embodiment lies in the way of illumination. In the first embodiment, the same input light is incident upon the first and the second phototransistors. In this embodiment, a first input light 44 is incident upon the first and the fourth phototransistors, and a second input light 45 is incident upon the second and the third phototransistors. The first and the second input lights 44, 45 are emitted from light sources set outside of the semiconductor substrate 35.

In this embodiment, the bias voltage of the first and the second optical bistable circuits is set to the value at which each of the optical bistable circuits is turned off when the input lights are incident upon both phototransistors simultaneously. Under this condition, the first optical bistable circuit is turned on only when the first input light 44 is "on" and the second input light 45 is "off". The second optical bistable circuit is turned on only when the first input light 44 is "off" and the second input light 45 is "on". Therefore, both of the optical bistable circuits are in the off state and do not emit output light when the state of the first input light coincides with the state of the second input light, and either one of the optical bistable circuits is in the on state and emits output light when the states are different for both input lights. This function is just the exclusive OR operation.

In the above embodiments, the semiconductor material used to construct the structure is the InGaAsP/InP system. However, it is natural that the structure can be constructed with other materials, such as the AlGaAs/GaAs and the InGaAs/InAlAs/InP systems.

Figure 5:
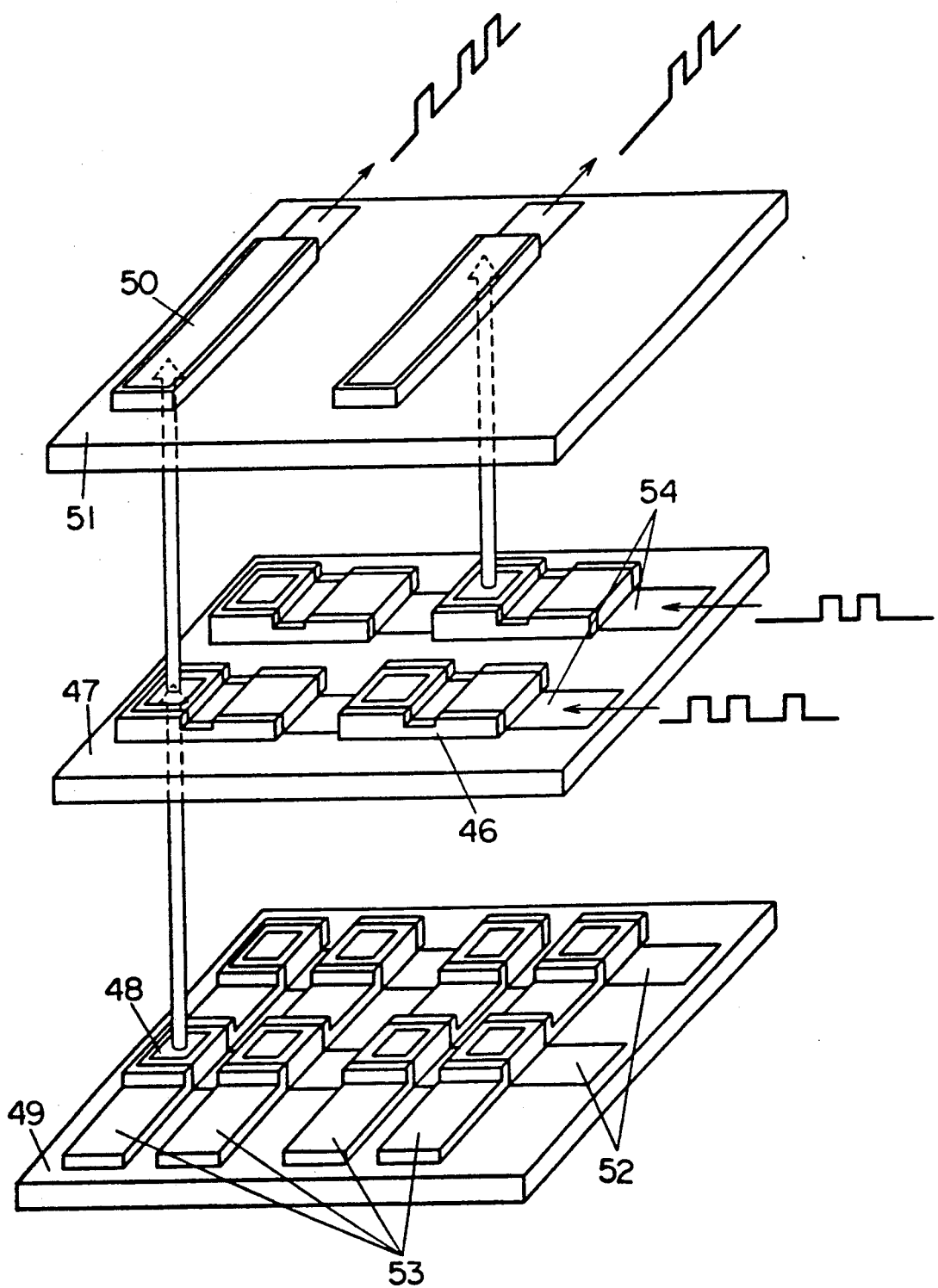
FIG. 5 is a perspective view of an optoelectronic memory, logic, and interconnection device according to a third embodiment of the present invention.

A perspective view of an optoelectronic memory, logic, and interconnection device according to a third embodiment of the present invention is shown in FIG. 5. The fundamental constituents of this device are an optical bistable circuit array 47 in which optical bistable circuits 46 are arranged in a two-dimensional array, a light emitting device array in which controlling light emitting devices 48 emit optical signals to control the on or off state of the optical bistable circuits 46 which are arranged in two-dimensional arrays, and a photodetector array 51 in which photodetectors 50 are arranged in one-dimensional array. The optical bistable circuit 46 is turned on and off with input light and emits output light in the on-state.

An example of such an optical bistable circuit can be constructed with an optical bistable switch which is a series connection of a switching light emitting device and a first phototransistor, a second phototransistor connected in parallel to the optical bistable switch, and a load resistor connected in series to the optical bistable switch. The switching light emitting device in the optical bistable circuit and the controlling light emitting device in the light emitting device array are preferred to be surface emitting lasers though other light emitting devices can be applied.

The light emitting device array 49 has two controlling light emitting devices corresponding to each optical bistable circuit 46. The lights emitted from the two controlling light emitting devices are incident upon the first and the second phototransistors in the optical bistable circuit. The optical bistable circuit is turned on when the light is incident upon the first phototransistor and turned off when incident upon the second phototransistor.

The light emitting device array 49 has X-address lines 52 connecting the anodes of the controlling light emitting devices 48 along column direction and Y-address lines 53 connecting the cathodes along the row direction. When current flows between a selected X-address line 52 and a selected Y-address line 53, the controlling light emitting device 48 on the intersection emits light. On the other hand, in the optical bistable circuit array 47, all the cathodes of the optical bistable circuits 46 are connected in parallel and the anodes are connected with the anode lines 54 along row direction. The data signals are supplied to the anode lines 54 to modulate the output power from the optical bistable switch in the on-state. The modulated data signal lights are detected by the photodetectors 50 in the photodetector array 51. The optical signals from the optical bistable circuits 46 along the same column are incident upon the same photodetector 50 and converted to electrical signals. The crossbar switching can be achieved with this optoelectronic interconnection device because the electrical signals put into the anode lines 54 along the row direction are converted to optical signals, which are again converted to electrical signals with the long photodetectors 50 along the column direction. In this device, the change of interconnection points and the data transmission through the unchanged interconnection points can be executed at the same time since the interconnection points are changed with the controlling signal light emitted from the controlling light emitting device.

Figure 6:
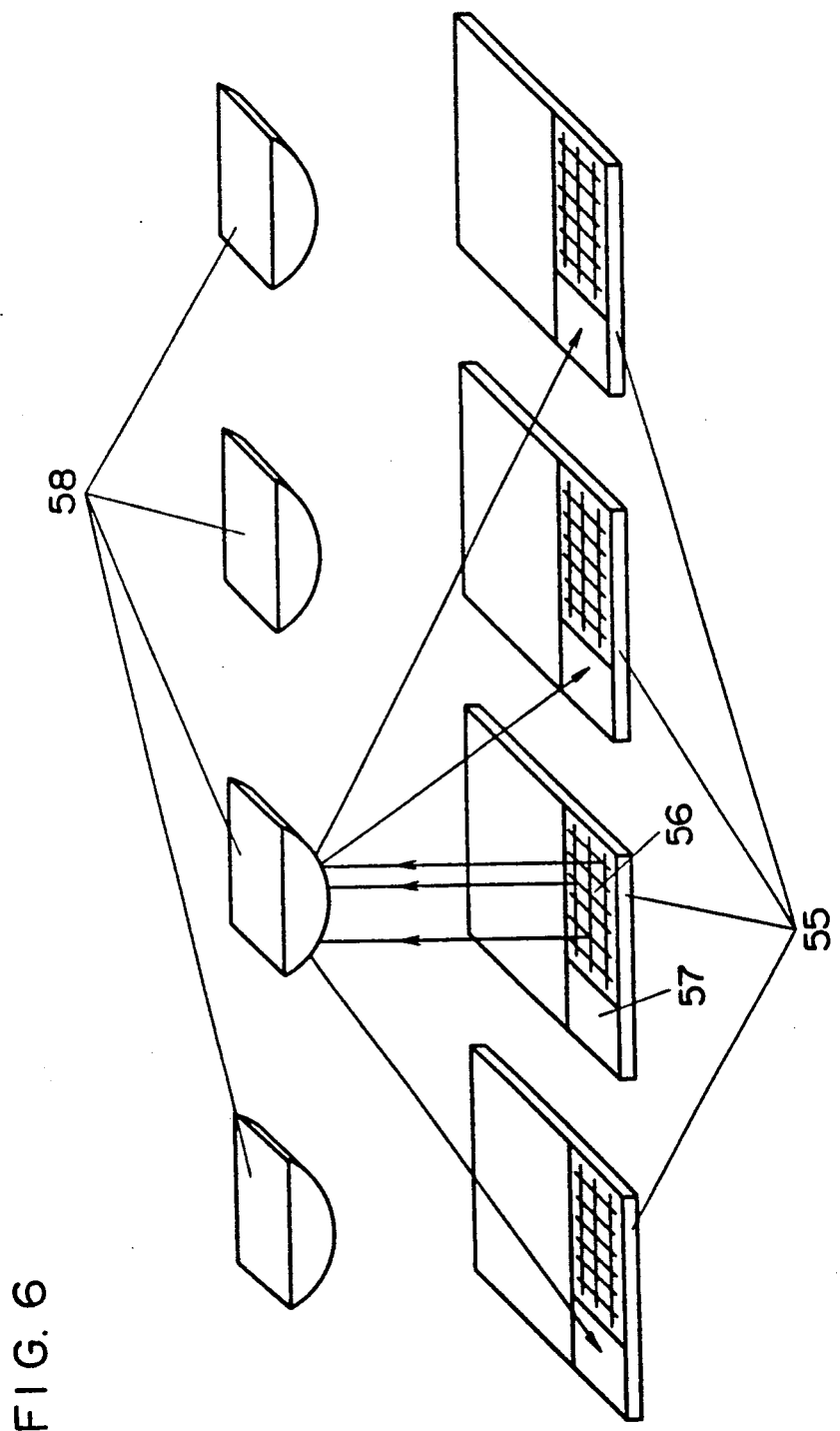
FIG. 6 is a perspective view of an optoelectronic memory, logic, and interconnection device according to a fourth embodiment of the present invention.

A perspective view of an optoelectronic memory, logic, and interconnection device according to a fourth embodiment of the present invention is shown in FIG. 6. In this embodiment, processing units 55 of a parallel processing computer are arranged in one-dimensional arrays. The processing units 55 include a light emitting unit 56 consisting of an optical bistable circuit array and a light emitting device array, and a photodetector 57. The optical bistable circuit array and the light emitting device array in the light emitting unit 56 have the same function as described in the explanation for the third embodiment. However, the data signal lights emitted from the optical bistable circuit are not directly incident upon the photodetectors but reflected with a light beam deflector 58 which is a semi-cylindrical convex mirror, set in opposition to the light emitting unit 56. Since the output angle of the reflected light is changed in relation to the position of the optical bistable circuit along the row direction, the photodetector on which the signal light is incident can be selected among the photodetectors in the processor units by selecting the position of the optical bistable circuit in the on-state. In other words, the processor unit to which the signal light is sent can be selected by choosing the Y-address of the optical bistable switch in the on-state.

In this embodiment, the crossbar switching function described in the third embodiment is utilized with free-space optical transmission function. Only with the former function, it is necessary to transmit the output electrical signal from the photodetector array to another processor unit with electrical interconnection lines. If the number of processor units is N, $N^2$ lines are necessary to connect the processor units. In contrast to this, electrical interconnection lines between processor units are not necessary at all in this embodiment since the free-space optical transmission is utilized for signal transmission between processor units.

Figure 7:
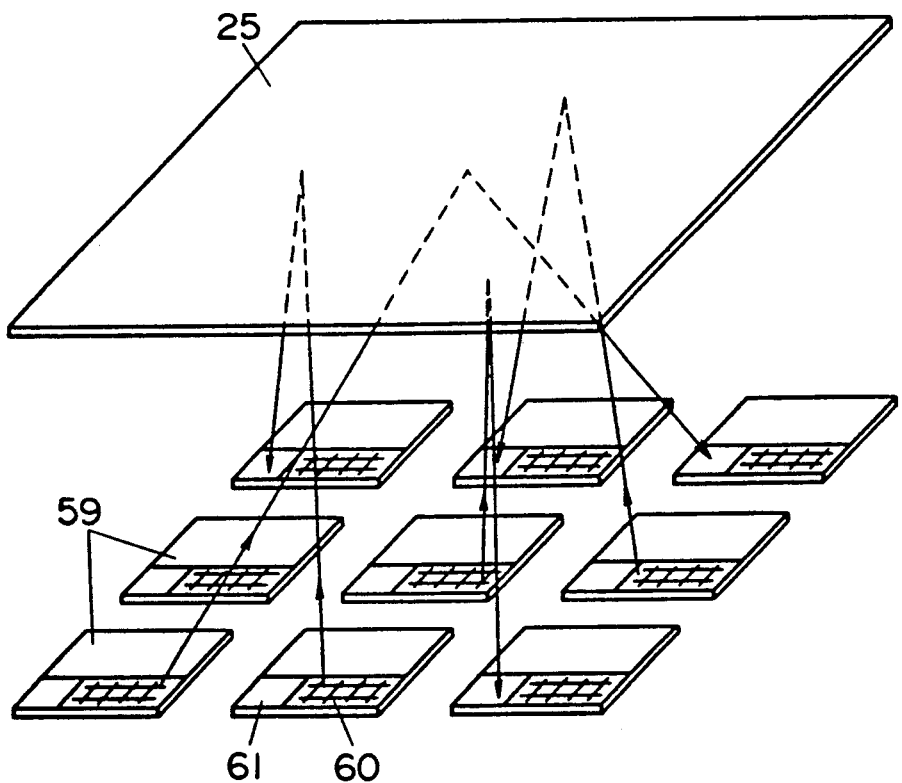
FIG. 7 is a perspective view of an optoelectronic memory, logic, and interconnection device according to a fifth embodiment of the present invention.
Figure 9:
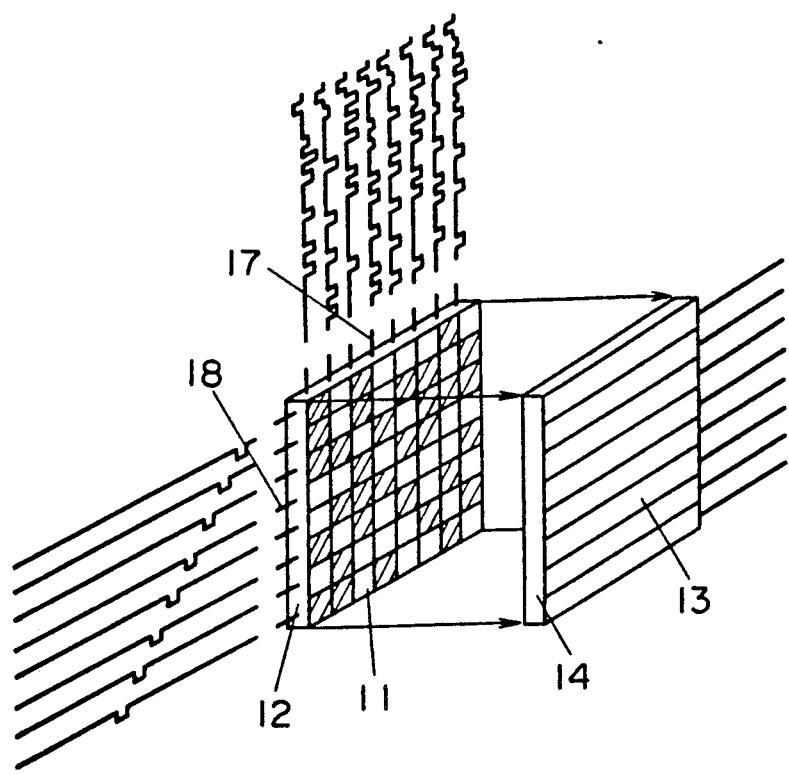
FIG. 9 is a perspective view of a conventional optoelectronic interconnection device.
Figure 10:
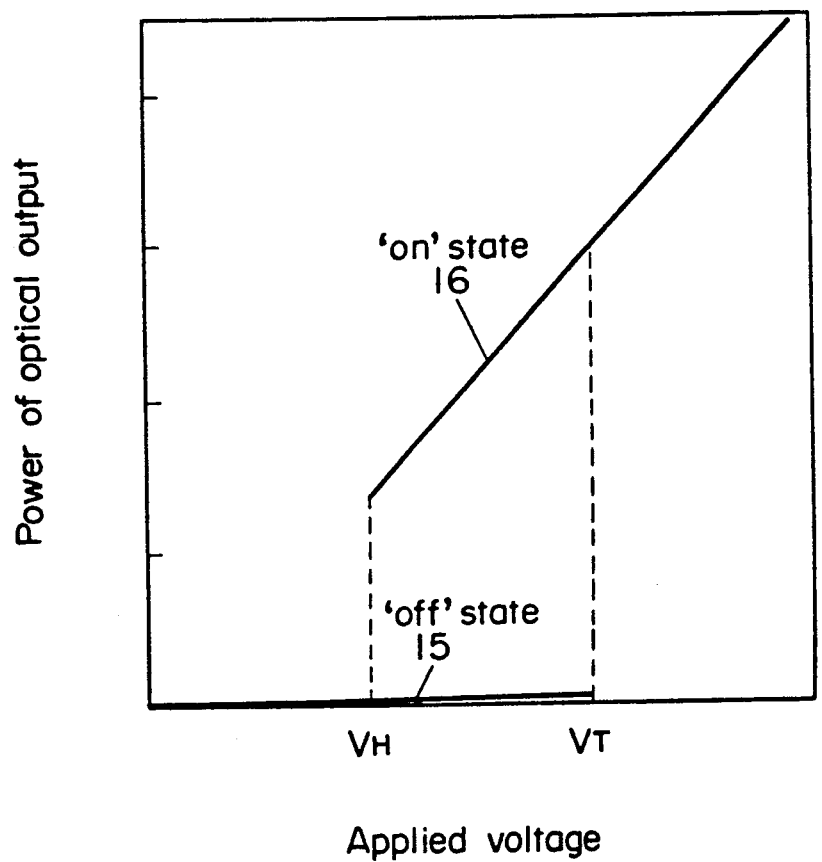
FIG. 10 is a diagram showing the voltage-light output characteristics of a conventional optical bistable switch.

A perspective view of an optoelectronic memory, logic, and interconnection device according to a fifth embodiment of the present invention is shown in FIG. 7. In this embodiment, processor units 59 of a parallel processing computer are arranged in two-dimensional arrays. The processor unit includes a light emitting unit 60 and a photodetector 61. The light emitting unit is a stack of a light beam deflector made of a holographic optical element, an optical bistable circuit array, and a light emitting device array. In this light emitting unit, all the optical bistable circuits in the optical bistable circuit array are connected in parallel and the same data signal light is emitted from the optical bistable switches in the on-state. The data signal light from the optical bistable switch is deflected with the light beam deflector in the light emitting unit 60 and the output angle is varied in relation to the position of the optical bistable switch emitting the data signal light. The data signal light with varied output angle is reflected with a mirror 62 set in opposition to the two-dimensional array of the processor units 59 and incident upon another processor unit. Therefore, the processor unit to which the signal light is sent can be selected two-dimensionally by choosing the X-address and Y-address of the optical bistable switch in the on-state.

In this embodiment, though the crossbar switching function demonstrated in the third and the fourth embodiments is not included, the reconfigurable interconnection among processor units arranged in two-dimensional array is achieved. To perform the reconfigurable interconnection among $N \times N$ processor units with electrical interconnection, $N^4$ electrical interconnection lines are necessary along with the circuit to select the connection lines. In contrast to this, two-dimensional reconfigurable interconnection is attained without any electrical interconnection lines by using the optical bistable circuit array, the light emitting device array, and the light beam deflector.

What is claimed is:

1. An optoelectronic memory, logic, and interconnection device comprising:
   an optical bistable circuit including,
      an optical bistable switch, said switch having a light emitting device and a first phototransistor connected in series, said first phototransistor detecting the light emitted from said light emitting device,
      a second phototransistor connected in parallel to said optical bistable switch, said second phototransistor does not detect the light emitted from said light emitting device, and
      a load resistor connected in series to said optical bistable switch;
   a power supply adapted to apply a variable voltage to said optical bistable circuit; and
   a light source adapted for putting the same input light into said first and said second phototransistors.

2. An optoelectronic memory, logic, and interconnection device comprising:
   a first optical bistable circuit including,
      a first optical bistable switch, said switch having a first light emitting device and a first phototransistor connected in series, said first phototransistor detecting the light emitted from said first light emitting device,
      a second phototransistor connected in parallel to said first optical bistable switch, said second phototransistor does not detect the light emitted from said first light emitting device, and
      a first load resistor connected in series to said first optical bistable switch;
   a second optical bistable circuit including,
      a second optical bistable switch, said second optical bistable switch having a second light emitting device and a third phototransistor connected in series, said third phototransistor detecting the light emitted from said second light emitting device,
      a fourth phototransistor connected in parallel to said second optical bistable switch, said fourth phototransistor does not detect the light emitted from said second light emitting device, and
      a second load resistor connected in series to said second optical bistable switch;
   a first light source adapted for putting a first input light into said first and said fourth phototransistors; and
   a second light source adapted for putting a second input light into said second and said third phototransistors.

3. An optoelectronic memory, logic, and interconnection device comprising:
   an optical bistable circuit array, having optical bistable circuits, said optical bistable circuits arranged in a two-dimensional array and adapted to be turned on and off with optical signals, said optical bistable circuit having a function of light emission; and
   a light emitting device array having controlling light emitting devices arranged in a two-dimensional array, said controlling light emitting devices adapted to emit optical signals to control the on or off state of said optical bistable circuit in said optical bistable circuit array, and
   said light emitting device array having conductive lines adapted to address selectively said controlling light emitting devices.

4. An optoelectronic memory, logic, and interconnection device of claim 3, wherein said controlling light emitting device is a surface emitting laser.

5. An optoelectronic memory, logic, and interconnection device of claim 3, wherein said optical bistable circuit further includes:
   an optical bistable switch, said optical bistable switch having a switching light emitting device and a first phototransistor connected in series;
   a second phototransistor connected in parallel to said optical bistable switch; and
   a load resistor connected in series to said optical bistable switch.

6. An optoelectronic memory, logic, and interconnection device of claim 5, wherein said switching light emitting device is a surface emitting laser.

7. An optoelectronic memory, logic, and interconnection device comprising:
   an optical bistable circuit array, having optical bistable circuits which emit light, said optical bistable circuits arranged in a two-dimensional array; and
   a light beam deflector for varying the output direction of a light beam emitted from said optical bistable circuit in relation to the position of said optical bistable circuit in said optical bistable circuit array.

8. An optoelectronic memory, logic, and interconnection device of claim 7, wherein said optical bistable circuit includes a surface emitting laser.

9. An optoelectronic memory, logic, and interconnection device of claim 7, wherein said light beam deflector is a convex mirror opposite to said optical bistable circuit array.

10. An optoelectronic memory, logic, and interconnection device of claim 7, wherein said light beam deflector is a holographic optical element.

* * * * *